(12) United States Patent
Ghoshal

(10) Patent No.: US 6,338,251 B1
(45) Date of Patent: Jan. 15, 2002

(54) MIXED THERMOELECTRIC COOLING APPARATUS AND METHOD

(75) Inventor: Uttam Shyamalindu Ghoshal, Austin, TX (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/359,608

(22) Filed: Jul. 22, 1999

(51) Int. Cl.[7] ................................................. F25B 21/02
(52) U.S. Cl. .............................................. 62/3.2; 62/3.4
(58) Field of Search ..................................... 62/3.2, 3.4

(56) References Cited

U.S. PATENT DOCUMENTS

| | | | |
|---|---|---|---|
| 3,879,229 A | 4/1975 | Gilbert ........................ 136/208 |
| 4,095,998 A | 6/1978 | Hanson ........................ 136/208 |
| 4,306,426 A | * 12/1981 | Berthet et al. .................... 62/3 |
| 4,306,613 A | * 12/1981 | Christopher ................... 165/32 |
| 4,328,677 A | * 5/1982 | Meckler ....................... 62/124 |
| 4,463,569 A | * 8/1984 | McLarty ........................... 62/3 |
| 4,490,982 A | * 1/1985 | Christmas ......................... 62/3 |
| 4,494,380 A | * 1/1985 | Cross .............................. 62/3 |
| 4,673,863 A | 6/1987 | Swarbrick ................... 322/2 R |
| 5,097,829 A | * 3/1992 | Quisenberry ................ 128/400 |
| 5,130,276 A | 7/1992 | Adams et al. ............... 437/225 |
| 5,279,128 A | 1/1994 | Tomatsu et al. ............... 62/3.4 |
| 5,361,587 A | 11/1994 | Hoffman ........................ 62/3.2 |
| 5,385,022 A | 1/1995 | Kornblit ........................ 62/3.2 |
| 5,448,891 A | 9/1995 | Nakagiri et al. ............... 62/3.1 |
| 5,465,578 A | 11/1995 | Barben et al. ................. 62/3.2 |
| 5,605,048 A | 2/1997 | Kozlov et al. ................. 62/3.2 |
| 5,650,904 A | 7/1997 | Gilley et al. ................... 361/56 |
| 5,704,213 A | * 1/1998 | Smith et al. ................... 62/3.7 |
| 5,842,353 A | * 12/1998 | Kuo-Liang ................... 62/190 |

OTHER PUBLICATIONS

WO 94/28364; A Peltier Device; Dec. 8, 1994 (Publication Date); Michael Graeme et al.
EP 0 667 498 A1; Method of Cooling a Unit of a Cascade Thermopile; Aug. 16, 1995; Kozlov et al.
05172424; Heat Pump Device; Jul. 9, 1993 (Publication Date); Nakagiri Yasushi
05039966; Heat Pump Device; Feb. 19, 1993 (Publication Date); Nakagiri Yasushi.

* cited by examiner

Primary Examiner—William C. Doerrler
Assistant Examiner—Mark S. Shulman
(74) Attorney, Agent, or Firm—Duke W. Yee; Casimer K. Salys; Stephen J. Walder, Jr.

(57) ABSTRACT

Apparatus and method for sub-ambient cooling using thermoelectric cooling in convention with dynamics conventional cooling techniques. In one form, a vapor phase cooling system provides a temperature (T) and is associated with a thermoelectric cooler. The thermoelectric cooler provides a differential temperature $\Delta T$ utilizing thermodynamics such as Peltier cooling. The thermoelectric cooler therefore provides a temperature of approximately $T-\Delta T$ to an object.

49 Claims, 7 Drawing Sheets

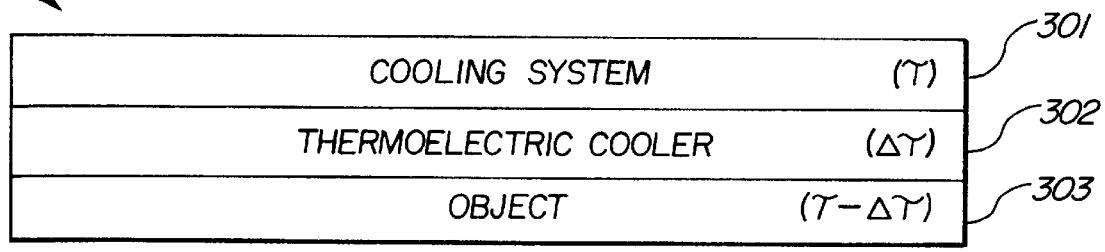
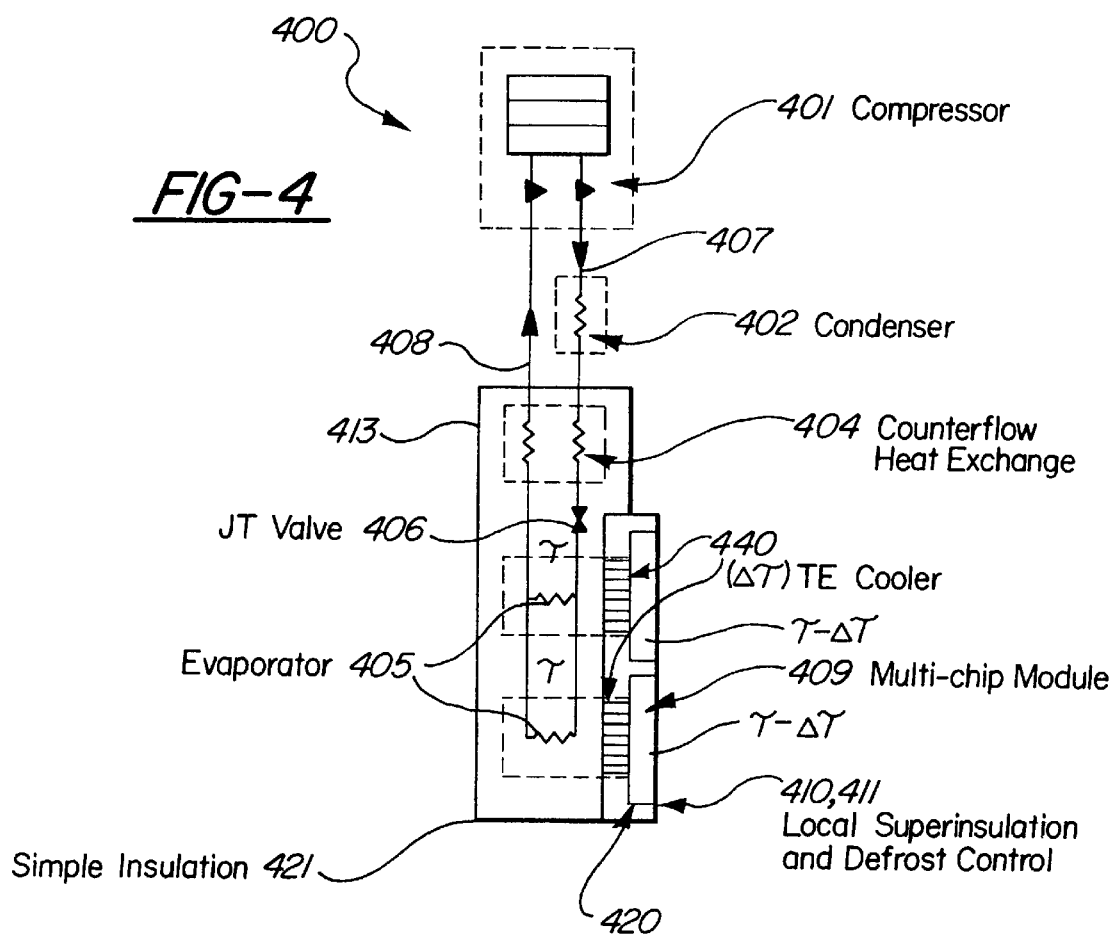

MIXED THERMOELECTRIC COOLING APPARATUS AND METHOD

FIELD OF THE INVENTION

The present invention generally relates to cooling systems, More particularly, the invention is directed to cooling apparatuses and methods utilizing a mix of thermoelectric cooling with at least one other type of cooling.

BACKGROUND OF THE INVENTION

Sub-ambient cooling is conventionally accomplished through gas/liquid vapor phase compression based refrigeration cycles using Freon type refrigerants to implement the heat transfers. Such refrigeration systems are used extensively for cooling human residences, foods, and vehicles. Sub-ambient cooling is also often used with major electronic systems such as mainframe server and workstation computers. Though vapor compression cooling can be very efficient, it does require significant moving hardware, including at a minimum, a compressor, a condenser, an evaporator, and related coolant transfer plumbing. As a result of the complexity and associated high cost, vapor compression cooling has not found material acceptance in small cooling applications, for example personal computers.

The fact that CMOS logic can operate materially faster as the temperature decreases has been well known for at least ten years. For example, if CMOS logic devices are operated at −50° C., the performance is improved by 50 percent over room ambient temperature operation. Liquid nitrogen operating temperatures, in the range of −196° C., have shown 200 percent performance improvements. Similar benefits have shown to accrue for integrated circuit wiring, where metal wiring resistances decrease by a factor of 2 for integrated circuits operated at −50° C. in comparison to room ambient operation. This improvement rivals the recent technological breakthrough of using copper wiring in integrated circuits to reduce interconnect resistance and thereby effectively increase the operating frequencies attainable. Thus, sub-ambient operation of integrated circuit logic devices, such as field effect transistors, as well as the interconnect wiring can materially improve the integrated circuit performance, leaving the question of how to accomplish such cooling in the confines of an ever decreasing size and materially shrinking cost environment.

Thermoelectric cooling is one alternative that has found some usage given the compact size of the prevalently used Peltier devices. A Peltier device is fabricated from semiconductor material such as bismuth telluride or lead telluride. Though new materials are now being evaluated in various universities, they have yet to reach fruition. The commonly used Peltier materials exhibit very high electrical conductivity and relatively low thermal conductivity, in contrast to normal metals which have both high electrical and thermal conductivity. In operation the Peltier devices transport electrons from a cold sink, at temperature $T_{cold}$, to a hot sink, at temperature $T_{hot}$, in response to an electric field formed across the Peltier device.

FIG. 1 schematically depicts a conventional Peltier type thermoelectric element (TE) 1 with DC power supply 2 created the electric field across TE 1 while at a load current 3. The desired heat transfer is from cold sink 4, at temperature $T_{cold}$, to hot sink 6, at temperature $T_{hot}$. As indicated in the equation of FIG. 1, the net heat energy transported is composed of three elements, the first representing the Peltier effect (thermoelectric) contribution, the second defining negative Joule heating effects, and the third defining negative conductivity effects. The thermoelectric component is composed of the Seebeck coefficient, the temperature of operation ($T_{cold}$) and the current being applied. The Joule heating component reflects that roughly half the Joule heating goes to the cold sink and remainder to the hot sink. Lastly, the negative component attributable to thermal conduction represents the heat flow through the Peltier device, as defined by the thermal conductivity of the Peltier device, from the hot sink to the cold sink. See equation (1).

$$q = \alpha T_{cold} I - \tfrac{1}{2} I^2 R - K \Delta T \qquad (1)$$

Peltier device thermoelectric cooling is very reliable in that the cooling is entirely solid state. The key negative aspect of thermoelectric cooling is the inefficiency, wherein a Peltier device cooling system efficiency is commonly only in the range of 20 percent for a relatively nominal temperature drop between the cold sink and the ambient. Equation (1) above clearly shows how quickly the Peltier device becomes inefficient. Since the thermoelectric component of the heat transport increases in direct proportion to the current, while the Joule heating increases in proportion to the square of the current, the thermal conduction is in direct proportion to the hot sink to cold sink temperature difference. For example, to cool at the rate of one watt at a sub-ambient temperature of 0° C., the Peltier cooling system must be powered with 5 watts. As the amount of heat to be transferred increases, the total power to be dissipated into the ambient mandates large convection devices and high output power supply circuits. Therefore, Peltier device thermoelectric cooling has poor efficiencies for large temperature differentials as compared to vapor compression cooling systems and as a result has not been considered a broadly applicable technology for improving integrated circuit performance.

Although vapor compression cooling systems are advantageous to current thermoelectric cooling configurations for sub-ambient cooling, such systems are not without limitations, especially for sub-zero centigrade cooling applications. Readily available vapor compression cooling systems are currently based on compressors and gas mixtures that are optimized for −20° C. operation. An example of such a sub-zero centigrade vapor compression cooling system 200 is shown in FIG. 2. Vapor compression cooling system 200 includes compressor 201, condenser 202, and a coolant distribution system 203 including a counterflow heat exchanger 204, evaporator 205, JT valve 206, input line 207, and return line 208 all of which are well known in the art.

Vapor compression cooling system 200 is used to cool multi-chip modules (MCMs) 209 through providing a refrigerant in close proximity to MCMs 209. The entire coolant distribution system 203 and MCMs 209 are insulated by superinsulation 210. Superinsulation 210 and defrost control 211 limits the amount of condensation 212 produced as byproduct of utilizing vapor compression cooling system 200 for cooling to sub-zero centigrade temperatures.

As one attempts to achieve operating temperatures below −20° C., there are numerous problems and limitations encountered with vapor compression cooling systems. For example, as the operating temperature is decreased, the volume for the compressor will increase causing space and weight limitations. Additionally, as the operating temperature is decreased the cost for cooling will increase. Cooling systems operating at temperatures below −20° C. require increased insulation and defrost control to prevent further condensation 212 and condensation related reliability problems. A further limitation of vapor compression systems operating below −20° C. is the inability to respond quickly to cooling demands. For example, advances in processing speeds of integrated circuits create fast temperature transients that require expedient cooling that current vapor compression systems can not accommodate.

The cost performance ratio of vapor compression cooling systems is determined by the cost and performance of compressors and fluids in the refrigeration cycle. Zero-centigrade vapor compression cooling systems can leverage the cost performance ratio by producing high volumes of zero-degree centigrade compressors utilizing standard refrigerant fluids (R134, etc.) for ubiquitous industry applications. However, to achieve temperatures below 0° C., such as −50° C., new compressors and fluids must be used. This added demand in performance significantly increases the cost performance ratio of current vapor compression cooling systems.

Thus, there are a number of very fundamental constraints on efficiency and differential temperature that limit the use of conventional cooling systems for sub-ambient cooling applications.

SUMMARY OF THE INVENTION

The present invention overcomes the fundamental individual constraints of conventional cooling systems and thermoelectric cooling by using thermoelectric coolers in conjunction with conventional cooling systems to optimize the operating temperature of thermoelectric coolers, thus creating an efficient cooling apparatus.

In one form, the invention relates to an apparatus comprising an object of a first nominal temperature, a cooling system of a second nominal temperature, the second nominal temperature being relatively greater than the first temperature, and a thermoelectric cooler situated to be coupled to the object and the cooling system.

In another form, the invention relates to a cooling apparatus operable in an ambient comprising a cooling system for absorbing thermal energy at a temperature T less than the ambient, and a thermoelectric cooler associated with the cooling system for providing a $\Delta T$ between the cooling system and an object so as to provide a temperature of approximately $T-\Delta T$ to the object.

In a still further form, the invention relates to a method of operating an apparatus having an object, a cooling system, and a thermoelectric cooler situated to be coupled to the object and the cooling system, comprising the steps of maintaining the object at a first nominal temperature, maintaining the cooling system at a second nominal temperature, wherein the second nominal temperature is relatively greater than the first temperature, and enabling the thermoelectric cooler.

In a still further form, the invention relates to a method of operating a cooling apparatus operable in an ambient having a cooling system, and a thermoelectric cooler associated with the cooling system comprising the steps of absorbing thermal energy at a temperature T less than the ambient from the thermoelectric cooler, providing, by the thermoelectric cooler, a temperature differential of $\Delta T$, and providing, to an object associated with the thermoelectric cooler, a temperature of approximately $T-\Delta T$.

In a particularized form of the invention, an apparatus provides a cooling system, such as a vapor phase cooling system coupled to a thermoelectric cooler including at least one Peltier device. The cooling system provides a temperature T thermally coupled to the thermoelectric cooler that provides a temperature change of $\Delta T$. The apparatus thus provides an overall temperature differential of approximately $T-\Delta T$ to an object. Efficiency of the thermoelectric cooler is obtained through operating the thermoelectric cooler at sub-ambient temperatures as provided by the cooling system.

These and other features of the invention will be more clearly understood and appreciated upon considering the detailed embodiments described hereinafter.

BRIEF DESCRIPTION OF THE DRAWINGS

Other objects, advantages, features and characteristics of the present invention, as well as methods, operation and functions of related elements of structure, and the combination of parts and economies of manufacture, will become apparent upon consideration of the following description and claims with reference to the accompanying drawings, all of which form a part of this specification, wherein like reference numerals designate corresponding parts in the various figures, and wherein:

FIG. 3 is a simplified block diagram illustration of the present invention.

FIG. 4 depicts a mixed cooling apparatus as may be used to provide sub-ambient cooling according to one embodiment of the present invention.

DETAILED DESCRIPTION OF A PREFERRED EMBODIMENT OF THE INVENTION

Figure 1:
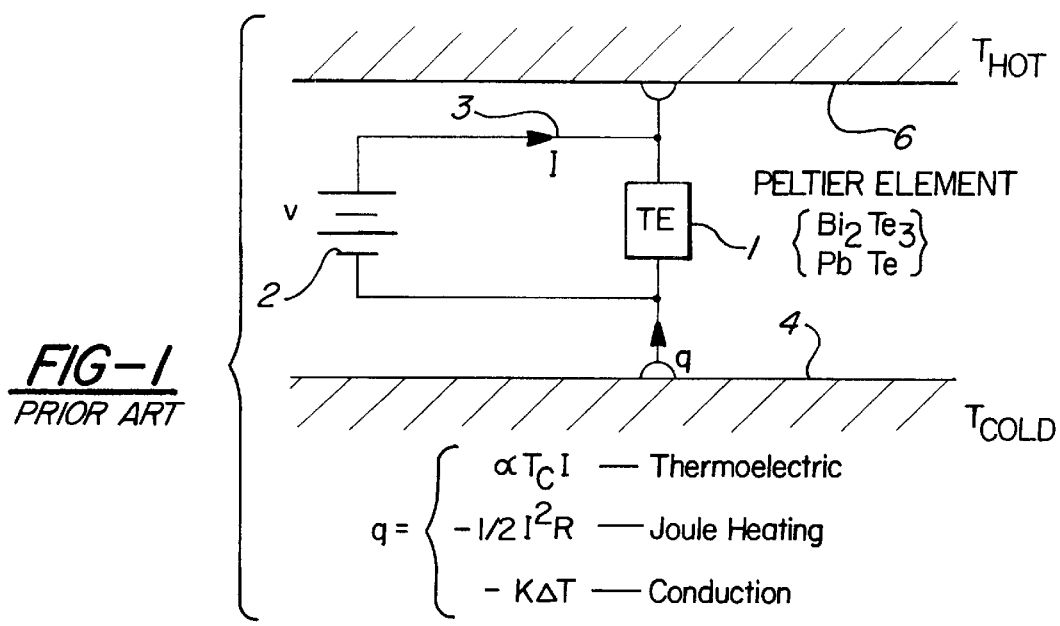
FIG. 1 schematically depicts a conventional statically operable Peltier device cooling system.

In the following detailed description of the preferred embodiments, reference is made to the accompanying drawings which form a part hereof, and in which is shown by way of illustration specific preferred embodiments in which the invention may be practiced. These embodiments are described in sufficient detail to enable those skilled in the art to practice the invention, and it is to be understood that other embodiments may be utilized and that logical, mechanical and electrical changes may be made without departing from the spirit or scope of the invention. To avoid detail not necessary to enable those skilled in the art to practice the invention, the description may omit certain information known to those skilled in the art. The following detailed description is, therefore, not to be taken in a limiting sense, and the scope of the present invention is defined only by the appended claims.

The conceptual groundwork for the present invention involves combining the cooling properties of thermoelectric coolers and at least one other cooling system, conventional or otherwise, to achieve advantages and efficiencies not otherwise obtainable individually. The objective is to utilize a cooling system to operate a thermoelectric cooler at a sub-ambient temperature T and then utilize the thermoelectric cooler to provide a ΔT so as to provide a temperature of approximately T–ΔT to an object.

FIG. 3 is a simplified schematic of the present invention and depicts a cooling apparatus 300 operable in an ambient including cooling system 301 for absorbing thermal energy at a temperature T less than the ambient. Also included is thermoelectric cooler 302 associated with cooling system 301 for providing a temperature differential ΔT between cooling system 301 and an object 303. As will be appreciated from further description object 303 may take any form as a solid, gas or liquid. Therefore, a temperature of approximately T–ΔT is provided to object 303. For example, cooling system 301 can have a nominal temperature T of –20° C., TEC 302 can provide a temperature differential ΔT of 50° C. using thermoelectric cooling and thus, object 303 is provided a temperature of approximately T–ΔT or –70° C.

Operating efficiency of TEC 302 is increased through placing TEC 302 between object 303 and cooling system 301 so that TEC 302 may be operated at sub-ambient temperature T to achieve greater temperature differentials ΔT. The operating efficiencies of TEC 302 increases at sub-ambient temperatures due to optimizing the figure-of-merit (ZT) for thermoelectric elements. For example, thermoelements made from alloys and superlattices such as p-$Bi_{0.5}Sb_{1.5}Te_3$ and n-$Bi_2Te_{2.7}Se_{0.3}$ are optimized at –20° C. At sub-ambient temperatures, electrical conductivity of these types of alloys and superlattices increases faster than the increase in thermal conductivity. A result of operating TEC 302 more efficiently is providing fast cool-down times for variably switching activities of microelectronic circuitry. In the above example, apparatus 300 provides a temperature of approximately T–ΔT of –70° C. In other embodiments of the present invention, apparatus 300 can be configured in aplurality of ways to achieve any desired temperature differentials without departing from the scope of the present invention. For example, TEC 302 can be configured to provide a temperature differential ΔT of –10° C. such that object 303 is maintained at a temperature T–ΔT or –10° C. with T=–20° C. In this manner TEC 302 acts as a thermal insulator between cooling system 301 and object 303.

The present invention provides a method of operating apparatus 300 having cooling system 301, TEC 302, and object 303. The method of cooling includes the steps of maintaining object 303 at a first nominal temperature, maintaining cooling system 301 at a second nominal temperature relatively greater than the first temperature, and enabling TEC 302. TEC 302 operates to cool object 303 through dissipating thermal energy away from object 303.

Although a single TEC is illustrated in FIG. 3, the present invention may be realized using many different types of TEC configurations. For example, TEC 302 illustrated in FIG. 3 can be a multi-staged thermoelectric cooler for providing greater temperature differentials ΔTs. TEC 302 can also be a single Peltier device strategically positioned over or about microelectronic components for providing spot cooling of objects. Therefore, any combination of thermoelectric coolers and devices can be utilized by the present invention. Additionally, TEC 302 can be operated to transfer thermal energy in either direction, depending on the polarity of the voltage applied to TEC 302. In the preferred embodiment of the present invention, TEC 302 is configured to provide cooling to object 303. Within the scope of the present invention, TEC 302 can be configured to provide thermal energy to object 302 without departing from the spirit of the invention.

Figure 2:
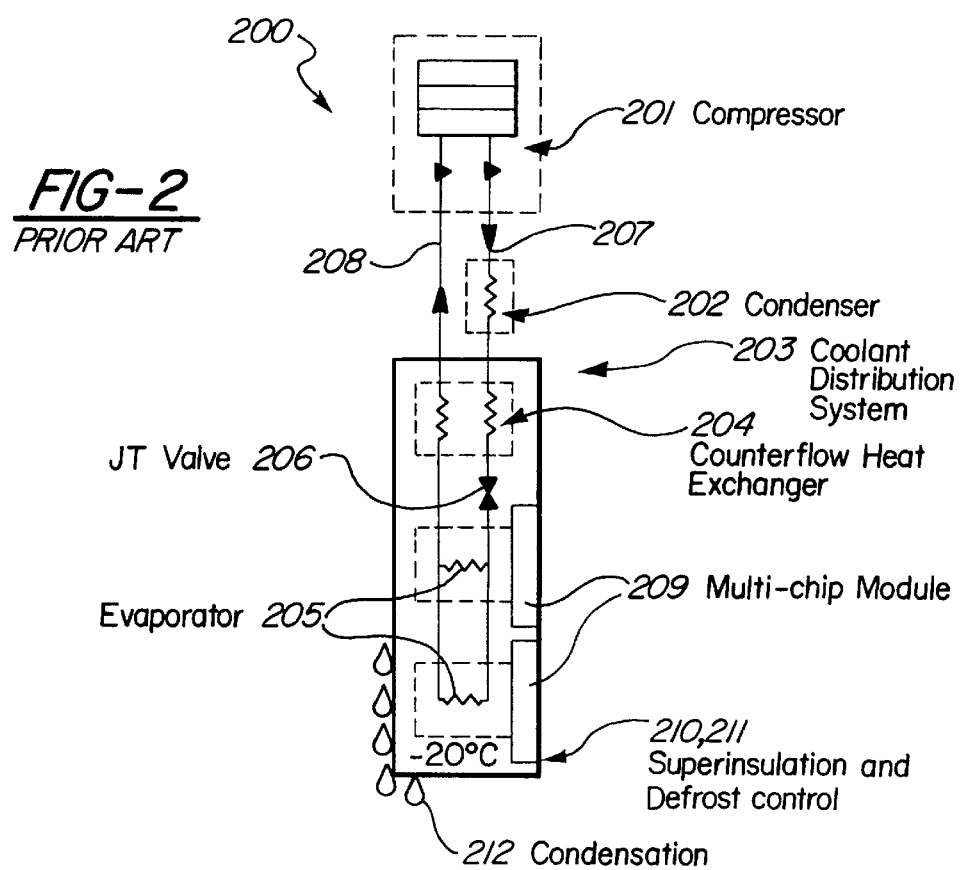
FIG. 2 schematically depicts a conventional vapor phase cooling system for providing sub-ambient cooling.

In one embodiment of the present invention, cooling system 301 can include a vapor phase cooling system such as the system described in connection with FIG. 2, for example. In another embodiment of the present invention, cooling system 301 can include micro-machined heat pipes for providing a nominal temperature. As known in the art, herein incorporated by reference micro-machined heat pipes are made utilizing current semiconductor technology methodologies. The heat pipes consist of small geometric channels inlaid over a surface area substrate. The micro-machined heat pipes provide cooling through circulating a coolant through the small geometric channels. The circulation can be created by convection so as to transfer thermal energy away from TEC 302.

FIG. 4 schematically depicts a mixed cooling apparatus according to a preferred embodiment of the present invention. Reference numerals utilized in FIG. 4 which are similar to numerals in FIG. 2 indicate like, similar or identical components. A temperature differential ΔT is achieved by TECs 440 coupled to at least one thermal sink 420 for providing a temperature T–ΔT to multi-chip module 409. Apparatus 400 also includes localized superinsulation 410 around TEC 440 and multi-chip module 409 to maintain constant temperatures and minimize condensation such as may be caused during sub-zero centigrade cooling. Defrost control 411 provides defrost control by heating condensation and evaporating moisture when needed. Simple insulation 421, as opposed to superinsulation, may then be utilized throughout the rest of apparatus 400 where appropriate. In this manner, a smaller area within localized superinsulation 410 may be cooled to temperature T–ΔT.

Figure 5:
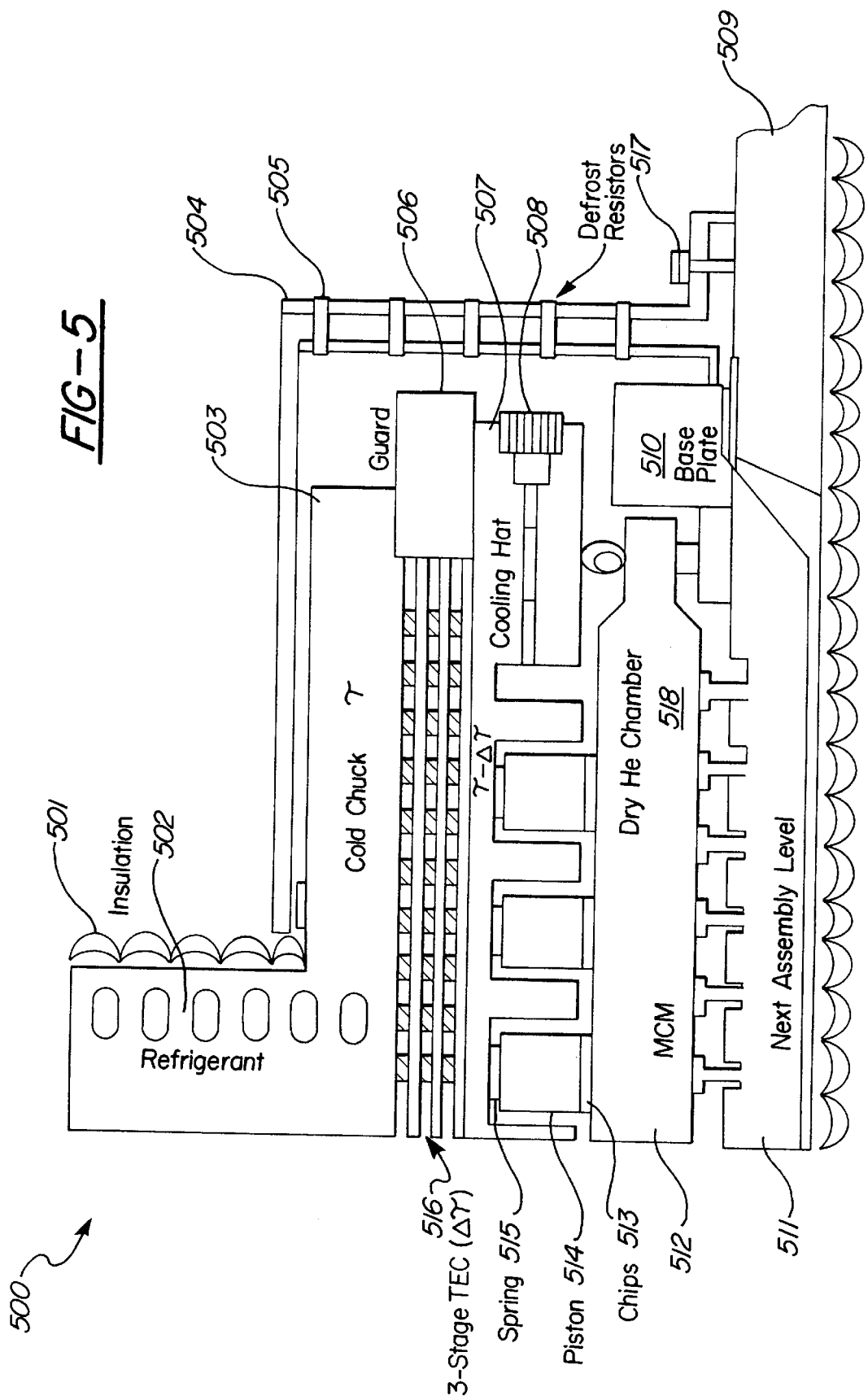
FIG. 5 depicts another embodiment of a cooling apparatus as may be used to provide sub-ambient cooling of integrated circuits and electronic modules according to the present invention.

FIG. 5 schematically depicts another embodiment of the present invention, apparatus 500. Apparatus 500 utilizes IBM's S/390 system components. Apparatus 500 utilizes a vapor phase cooling system at temperature T and a 3-stage thermoelectric cooler 516 for providing a temperature differential ΔT and sub-zero centigrade temperature of T–ΔT. Apparatus 500 includes a refrigerant within cooling system 502, and cold chuck 503 for providing a temperature of approximately T–ΔT. Also included is defrost control 504 with defrost resistors 505, and defrost receptacle 509. Apparatus 500 includes base plate 510 for mounting multi-chip module (MCM) 512, and second assembly level 511 adjacent to MCM 512. Mounted on MCM 512 are microelectronic circuits (chips) 513 requiring cooling by apparatus 500. Pistons 514 and springs 515 are used to ensure thermal contact is maintained between cooling hat 507 and MCM 512. Within cooling hat 507 is dry helium chamber 518 and control knob 508.

In a preferred embodiment of the present invention, cooling hat 507 is coupled to TEC 516 for cooling MCM 512 to a temperature of approximately T–ΔT. TEC 516 is a 3-stage thermoelectric cooler and is positioned between cooling system's 502 cold chuck 503 and cooling hat 507. Cold chuck 503 and cooling hat 507 are thermally isolated by guard 506. The efficiency of 3-stage TEC 516 is increased by maintaining operation of the hot side of 3-stage TEC 516 at or about a temperature T of 0° C. and the cold side of TEC 516 at or about a temperature T–ΔT of –50° C. This allows 3-stage TEC 516 to operate efficiently and react quickly to rapid changes in the temperature of MCM 512.

Figure 6:
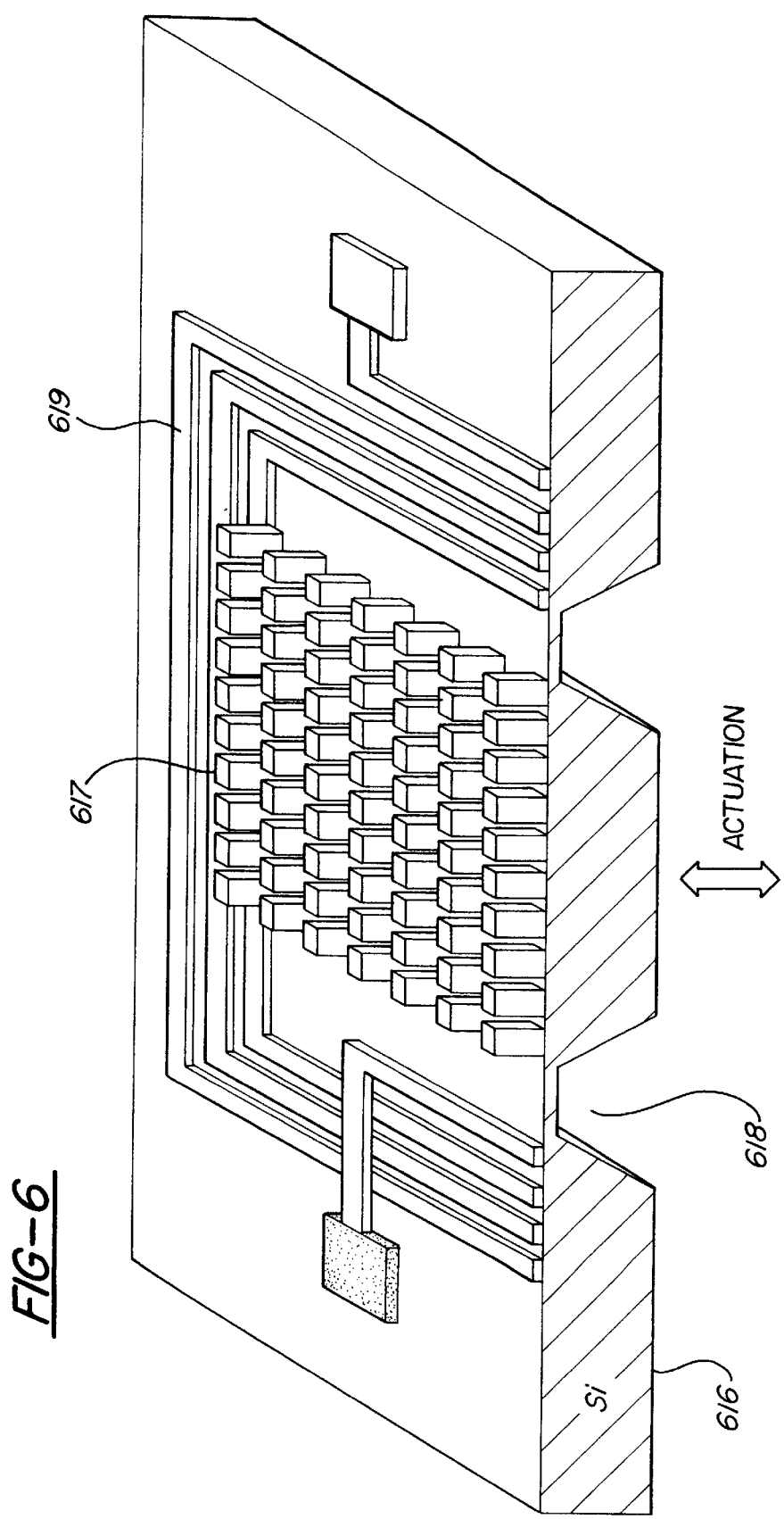
FIG. 6 schematically depicts a microelectromechanical systems (MEMS) device.

FIG. 6 schematically illustrates the structure of a representative microelectromechanical systems (MEMS) switch of the type particularly suited to the present invention. For a further discussion and description of MEMS and the uses and applications of MEMS see U.S. Pat. No. 5,867,990 issued Feb. 9, 1999 to common inventor and assignee as the present application and which is hereby incorporated by reference. Since MEMS technology is still in its infancy, the switch depicted in FIG. 6 merely illustrates one of many potential switch configurations suitable to provide a selective electrical and thermal coupling between the thermoelectric element and the sinks. The switch shown in FIG. 6 is fabricated using conventional integrated circuit techniques so as to form on a surface of silicon chip 616 an array of nickel magnets 617 amenable to a slight displacement by movement at thin flexible membranes 618. Introduction of an electrical current into spiral coil 619 produces a force adequate to translate the magnetic array in a direction perpendicular to the plane of the silicon chip. The MEMS switch in FIG. 6 should have a relatively low thermal conductivity when opened yet a relatively high electrical and thermal conductivity when closed by actuation. Since the MEMS device in FIG. 6 is to accomplish both electrical and thermal switching, numerous evolutionary refinements are expected to accentuate the dual functions.

Figure 7:
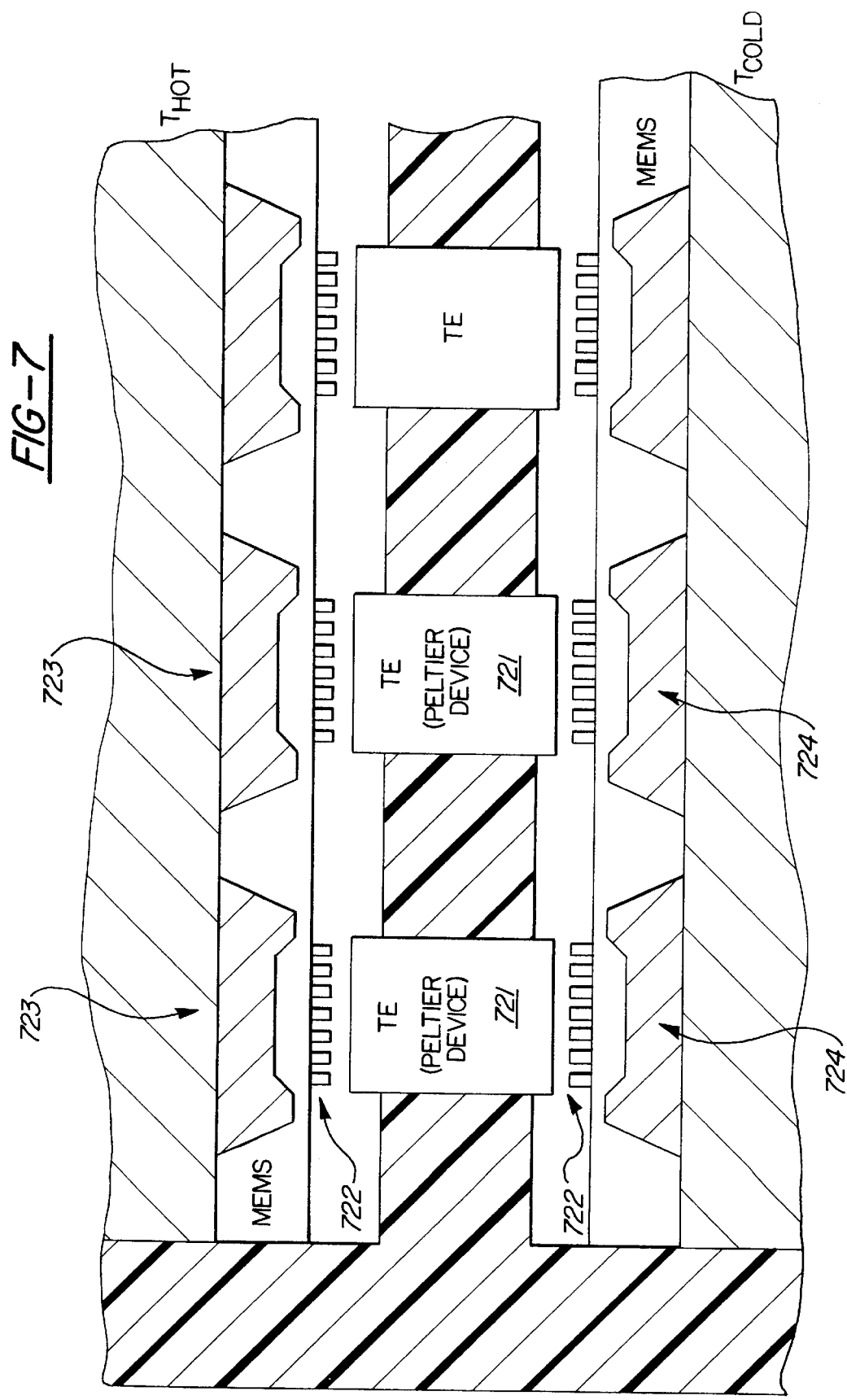
FIG. 7 depicts by schematic cross-section an array of MEMS devices and Peltier type thermoelectric elements.

FIG. 7 illustrates the use of an array of MEMS devices to selectively establish electrical and thermal connections between the Peltier type thermoelectric devices and sinks. The spacing between thermoelectric elements 721 and magnetic arrays 722 of hot and cold sink MEMS switches 723 and 724, respectively, is expected to be in the nominal range of half a micron. This dimension is expected to allow a nominal size electrical coil 619 (FIG. 6) to initiate actuation of the switch structures. Since switch cycling is expected to occur in the order of seconds, the reliability associated with kilohertz frequency switching of MEMS devices should not be a problem.

The MEMS type thermal switch described with reference to the illustrations in FIGS. 6 and 7 is merely one of many potential switch configurations. For example, it is fully contemplated that electrostatic forces generated in capacitive switch structures could be used to accomplish similar objectives. The underlying goal for all the switches is to maximize the thermal conductivity extremes for switch positions, such that when the switch is closed the thermal path between the thermoelectric element and the sink has a maximum thermal conductance while for the open switch the thermal conductance is the minimum attainable, while minimizing electrical conduction Joule heating and maximizing the extremes of the electrical switch states.

The depiction in FIG. 7 portrays a plurality of thermoelectric elements and MEMS switches configured in arrays. The multiplicity of thermoelectric elements and switches ensures that the transient characteristics which underlie the present invention can be achieved within the dimensions of the thermoelectric element and switch materials. Stated otherwise, it is expected that the isolation of the thermoelectric heat transfer from the Joule heating and conduction components is most effectively accomplished with relatively small thermal capacity thermoelectric elements, commonly Peltier devices, and correspondingly small MEMS type switches.

Figure 8:
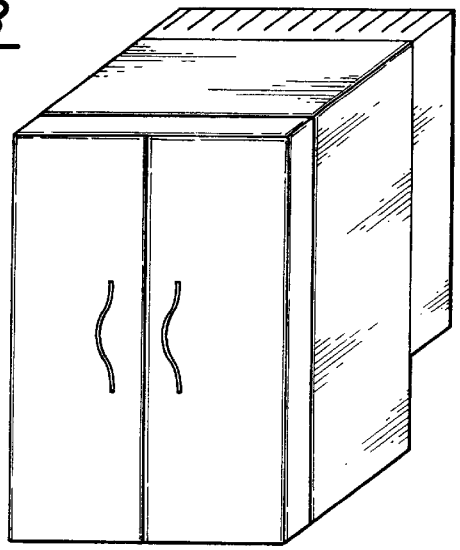
FIG. 8 schematically depicts the extended use of the invention to a food refrigeration system.

FIG. 8 schematically illustrates the use of the present invention in an extended array form to efficiently and cleanly operate a food refrigerator. The high efficiency of an apparatus utilizing mechanical and thermoelectric cooling system is characterizing the present invention facilitates the migration of mixed cooling from highly selective and limited applications, such as mainframe computer system cooling, to major appliances in substantially every home.

Figure 9:
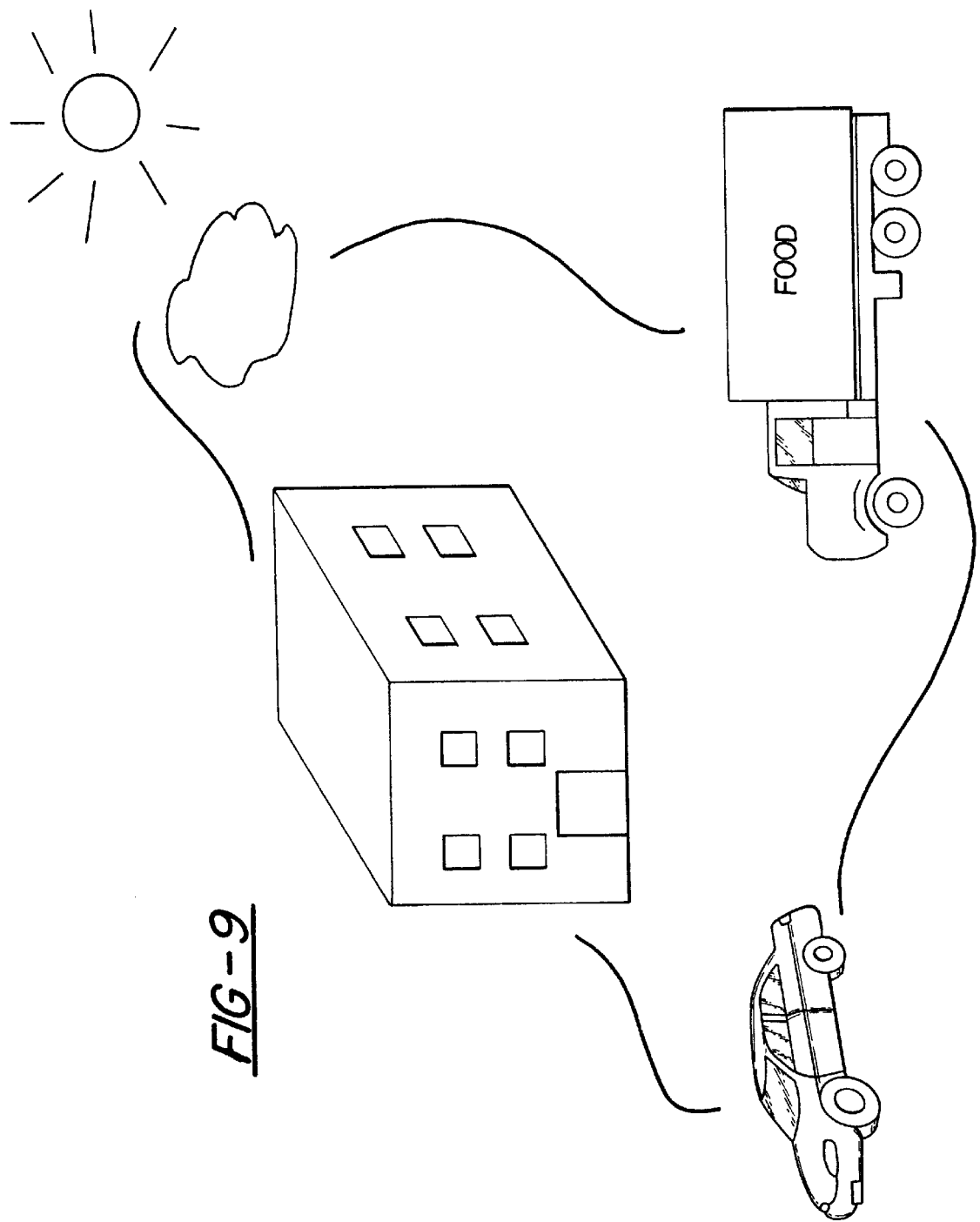
FIG. 9 schematically depicts potential applications and benefits of the invention as applied to various human residences and transportation media.

Still further applications are schematically depicted in FIG. 9, as the concepts underlying the present invention are further refined and extended in size to encompass major heat transfer applications encompassing residential and office cooling, food transportation systems, and personal vehicle cooling.

Figure 10:
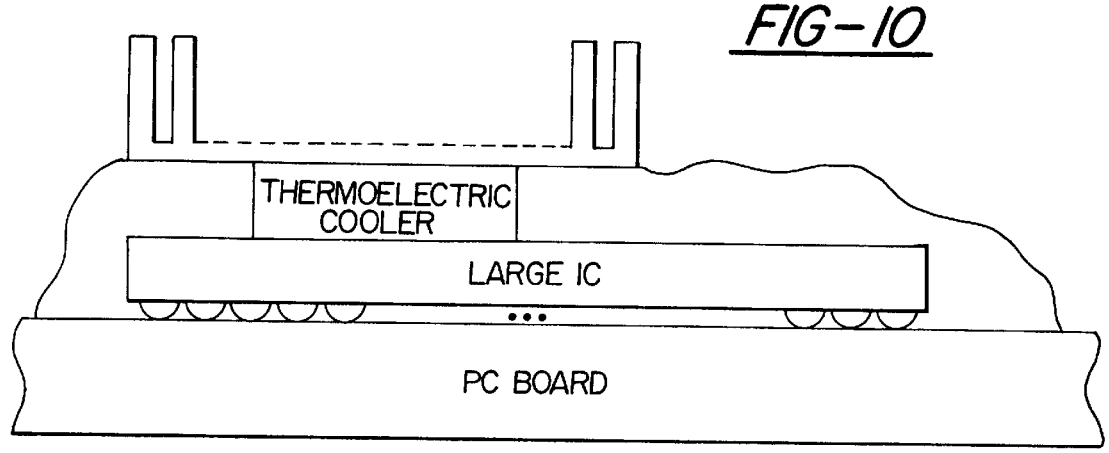
FIG. 10 schematically depicts the application of a small thermoelectric cooler to locally cool a selected part of an integrated circuit chip.

FIG. 10 schematically illustrates an application somewhat at the other end of the spectrum, where a micro size cooling apparatus is selectively bonded to parts of an integrated circuit chip for purposes of selective region cooling to control integrated circuit parameters. Such localized or spot cooling applications are particularly useful for voltage controlled oscillators, phase detectors, mixers, low noise amplifiers, lasers, photodiodes, and various material type optoelectric circuits.

The present invention has very broad applicability in part because it is not constrained to specific thermoelectric materials, cooling systems or electronic configurations. The invention utilizes the thermal dynamics of thermoelectric coolers in combination with cooling systems, such as vapor phase cooling systems, to isolate heat transfer characteristics and attain higher cooling efficiency.

It will be understood by those skilled in the art that the embodiments set forth hereinbefore are merely exemplary of the numerous arrangements for which the invention may be practiced, and as such may be replaced by equivalents without departing from the invention which will now be defined by appended claims.

Although an embodiment of the present invention has been shown and described in detail herein, along with certain variants thereof, many other varied embodiments that incorporate the teachings of the invention may be easily constructed by those skilled in the art. Accordingly, the present invention is not intended to be limited to the specific form set forth herein, but on the contrary, it is intended to cover such alternatives, modifications, and equivalents, as can be reasonably included within the spirit and scope of the invention.

I claim:

1. An apparatus comprising:
   an object;
   an active cooling system; and
   a thermoelectric cooler situated to be between the object and the active cooling system and coupled to the object and said active cooling system, wherein the object is thermally insulated from the active cooling system while being thermally coupled to the thermoelectric cooler such that heat transfer between the object and the active cooling system is through the thermoelectric cooler.

2. The apparatus, as recited in claim 1, wherein the thermoelectric cooler includes at least one thermoelectric element.

3. The apparatus, as recited in claim 1, wherein the thermoelectric cooler is a multi-stage thermoelectric cooler.

4. The apparatus, as recited in claim 1, wherein the thermoelectric cooler includes at least one Peltier device.

5. The apparatus, as recited in claim 1, wherein said active cooling system includes a vapor phase cooling system.

6. The apparatus, as recited in claim 1, wherein said active cooling system includes a micro-machined heat pipe cooling system.

7. The apparatus, as recited in claim 1, wherein the object is a thermal sink.

8. The apparatus, as recited in claim 1, wherein said object is thermally associated with a food refrigeration system.

9. The apparatus, as recited in claim 1, wherein said object is thermally associated with a vehicle occupant cooling system.

10. The apparatus, as recited in claim 1, wherein said object is at least one integrated circuit device.

11. The apparatus, as recited in claim 1, further comprises at least one microelectromechanical (MEMS) device.

12. A cooling apparatus operable in an ambient comprising:
a multi-chip module;
a cooling system for absorbing thermal energy at a temperature T less than the ambient; and
a thermoelectric cooler associated with said cooling system for providing a $\Delta T$ between said cooling system and said multi-chip module so as to provide a temperature of approximately T–$\Delta T$ to said multi-chip module.

13. The apparatus, as recited in claim 12, wherein said object is thermally coupled to said thermoelectric cooler.

14. The apparatus, as recited in claim 12, wherein said thermoelectric cooler includes at least one thermoelectric element.

15. The apparatus, as recited in claim 12, wherein said thermoelectric cooler is a multi-stage thermoelectric cooler.

16. The apparatus, as recited in claim 12, wherein said thermoelectric cooler includes at least one Peltier device.

17. The apparatus, as recited in claim 12, wherein said cooling system includes a vapor phase cooling system.

18. The apparatus, as recited in claim 12, wherein said cooling system includes a micro-machined heat pipe cooling system.

19. The apparatus, as recited in claim 12, wherein said multi-chip module is a thermal sink.

20. The apparatus, as recited in claim 12, wherein said multi-chip module is thermally associated with a food refrigeration system.

21. The apparatus, as recited in claim 12, wherein said multi-chip module is thermally associated with a vehicle occupant cooling system.

22. The apparatus, as recited in claim 12, wherein said multi-chip module includes at least one integrated circuit device.

23. The apparatus, as recited in claim 12, further comprises at least one microelectromechanical (MEMS) device.

24. A method of operating an apparatus having an object, a cooling system, and a thermoelectric cooler situated to be coupled to the object and the cooling system, comprising the steps of:
maintaining the object at a first nominal temperature;
maintaining the cooling system at a second nominal temperature; wherein the second nominal temperature is relatively greater than the first temperature; and
enabling the thermoelectric cooler, wherein the object is thermally insulated from the active cooling system while being thermally coupled to the thermoelectric cooler such that heat transfer between the object and the active cooling system is through the thermoelectric cooler.

25. The method, as recited in claim 24, wherein the thermoelectric cooler operates to dissipate thermal energy from the object.

26. The method, as recited in claim 24, wherein the thermoelectric cooler includes at least one thermoelectric element.

27. The method, as recited in claim 24, wherein the thermoelectric cooler is a multi-stage thermoelectric cooler.

28. The method, as recited in claim 24, wherein the thermoelectric cooler includes at least one Peltier device.

29. The method, as recited in claim 24, wherein the cooling system includes a vapor phase cooling system.

30. The method as recited in claim 24, wherein the cooling system includes a micro-machined heat pipe cooling system.

31. The method, as recited in claim 24, wherein the object is a thermal sink.

32. A method of operating a cooling apparatus operable in an ambient having a cooling system, and a thermoelectric cooler associated with the cooling system comprising the steps of:
absorbing thermal energy at a temperature T less than the ambient from the thermoelectric cooler;
providing, by the thermoelectric cooler, a temperature differential of $\Delta T$; and
providing, to a multi-chip module associated with the thermoelectric cooler, a temperature of approximately T–$\Delta T$.

33. The method, as recited in claim 32, wherein said multi-chip module is thermally coupled to the thermoelectric cooler.

34. The method, as recited in claim 32, wherein the thermoelectric cooler includes at least one thermoelectric element.

35. The method, as recited in claim 32, wherein the thermoelectric cooler is a multi-stage thermoelectric cooler.

36. The method, as recited in claim 32, wherein the thermoelectric cooler includes at least one Peltier device.

37. The method, as recited in claim 32, wherein said cooling system includes a vapor phase cooling system.

38. The method, as recited in claim 32, wherein said cooling system includes a micro-machined heat pipe cooling system.

39. The method of claim 32, wherein said multi-chip module is a thermal sink.

40. The apparatus of claim 1, wherein the object has a first nominal temperature and the cooling system has a second nominal temperature, the second nominal temperature being relatively greater than the first nominal temperature.

41. An apparatus for cooling a microelectronic circuit, comprising:
a cooling system having a cold chuck;
at least one thermoelectric cooler thermally coupled to the cooling system via the cold chuck; and
a base plate for mounting at least one microelectronic circuit device such that the microelectronic circuit device is in thermal contact with the thermoelectric cooler, wherein the cooling system is maintained at a temperature T, the thermoelectric cooler provides a temperature differential $\Delta T$, and the cold chuck provides a temperature of approximately T–$\Delta T$.

42. The apparatus of claim 41, further comprising a cooling hat thermally coupled to the at least one microelectronic circuit device and thermally coupled to the at least one thermoelectric cooler, wherein the microelectronic circuit device is in thermal contact with the at least one thermoelectric cooler via the cooling hat.

43. The apparatus of claim 41, wherein the microelectronic circuit device is a multi-chip module on which at a plurality of microelectronic chips are mounted.

44. The apparatus of claim 42, wherein the cooling hat includes a dry helium chamber.

45. The apparatus of claim 41, wherein the cooling system is a vapor phase cooling system.

46. The apparatus of claim 45, further comprising a defrost system.

47. The apparatus of claim 41, wherein a hot side of the at least one thermoelectric cooler is maintained at the temperature T and a cold side of the at least one thermoelectric cooler is maintained at a temperature of approximately T−ΔT.

48. The apparatus of claim 41, wherein the at least one thermoelectric cooler includes an array of thermoelectric coolers.

49. The apparatus of claim 48, further comprising an array of microelectromechanical system thermal switches coupled to the array of thermoelectric coolers.

* * * * *